US011005253B2

(12) United States Patent
Donath

(10) Patent No.: US 11,005,253 B2
(45) Date of Patent: May 11, 2021

(54) CIRCUIT AND METHOD OF OVER-CURRENT PROTECTION

(71) Applicant: Infineon Technologies AG, Neubiberg (DE)

(72) Inventor: Stephan Donath, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 410 days.

(21) Appl. No.: 15/948,290

(22) Filed: Apr. 9, 2018

(65) Prior Publication Data

US 2018/0294643 A1    Oct. 11, 2018

Related U.S. Application Data

(60) Provisional application No. 62/482,928, filed on Apr. 7, 2017.

(51) Int. Cl.
*H02H 3/093* (2006.01)
*H02H 1/00* (2006.01)
*H03K 21/38* (2006.01)

(52) U.S. Cl.
CPC ......... *H02H 3/0935* (2013.01); *H02H 1/0007* (2013.01); *H03K 21/38* (2013.01)

(58) Field of Classification Search
CPC .... H02H 1/0007; H02H 3/093; H02H 3/0935; H02H 7/226; H03K 21/38; H03K 21/02
See application file for complete search history.

(56) References Cited

U.S. PATENT DOCUMENTS

| | | | | |
|---|---|---|---|---|
| 5,208,720 A | * | 5/1993 | Fraisse | H02H 3/0935 361/94 |
| 5,633,776 A | * | 5/1997 | Juncu | H01H 71/123 335/32 |
| 5,994,790 A | * | 11/1999 | Nagashima | H02H 3/087 307/10.1 |
| 8,953,294 B2 | | 2/2015 | Graf et al. | |
| 2005/0078024 A1 | * | 4/2005 | Harrington | H02J 1/14 341/155 |
| 2008/0174928 A1 | * | 7/2008 | Liu | H02H 3/093 361/93.1 |
| 2011/0110009 A1 | * | 5/2011 | Sugimoto | H03K 17/0822 361/93.1 |
| 2014/0347774 A1 | * | 11/2014 | Uehara | H02H 3/0935 361/87 |

(Continued)

OTHER PUBLICATIONS

AEI Cables, "Current Ratings," compiled from BS 76871: 2008 Requirements for Electrical Installations: IEE Wiring Regulations 17th Edition and ERA Reports 69-30 Part III and Part V, Mar. 15, 2012, 13 pages.

(Continued)

*Primary Examiner* — Fred E Finch, III
(74) *Attorney, Agent, or Firm* — Slater Matsil, LLP

(57) ABSTRACT

A method of over-current protection includes: determining a current flowing through a first element to be protected, comparing the determined current with a plurality of thresholds, controlling a counter based on the comparing the determined current with a plurality of thresholds, and stopping the current flowing through the first element by activating a switch in series with the first element when an output of the counter reaches a predetermined counter threshold.

25 Claims, 8 Drawing Sheets

(56) References Cited

U.S. PATENT DOCUMENTS

| | | |
|---|---|---|
| 2016/0109212 A1 | 4/2016 | Bader et al. |
| 2017/0149234 A1* | 5/2017 | Fomenko ............... G01R 19/00 |
| 2017/0194783 A1* | 7/2017 | De Maglie ........... H02H 3/0935 |
| 2019/0162760 A1* | 5/2019 | Yamahira ................. H02H 3/08 |
| 2020/0153230 A1* | 5/2020 | Atluri .................... H02H 3/066 |

OTHER PUBLICATIONS

NXP Semiconductors, "Single Intelligent High-current Self-protected High-side Switch (2.0 mOhm)," Freescale Semiconductor Technical Data, Document No. MC33982, Rev. 18.0, Sep. 2014, 37 pages.

* cited by examiner

CIRCUIT AND METHOD OF OVER-CURRENT PROTECTION

CROSS-REFERENCE TO RELATED APPLICATIONS

This application claims the benefit of U.S. Provisional Application No. 62/482,928, filed on Apr. 7, 2017, which application is hereby incorporated herein by reference in its entirety.

TECHNICAL FIELD

The present invention relates generally to an electronic circuit, and, in particular embodiments, to a circuit and method of over-current protection.

BACKGROUND

Electrical cables are pervasive in many applications, such as personal electronics, automotive, and industrial applications. Electrical cables are typically made of electrically conductive material, such as copper, and may be used to electrically connect two components, allowing the flow of electricity between them. There are many types of electrical cables, such as power cables, coaxial cables, and twisted-pair cables. Some electrical cables include a collection of wires insulated from each other. Other electrical cables may include a single wire. Each type of cable may be optimized for a particular use.

Electrical cables may be damaged, destroyed, or present a safety hazards when stressed with an over-current event. Over-current protection circuits, therefore, may be used to protect electrical cables from over current events by limiting or stopping a current flowing through the element being protected.

Fuses have been used to protect a power source, a load, a cable, wiring systems, electrical equipment, and other electrical component from an over-current event. A fuse is typically a low resistance element that would interrupt the flow of current through it when current beyond the fuse's current rating flows through it. Fuses typically include a thin metal filament that is capable of handling current up to the fuse's current rating, but is configured to melt, and thus interrupting the flow of current, when the fuse's current rating is exceeded. Fuses may be referred to as a sacrificial device because the tripping of the fuse is an irreversible event. In other words, a blown fuse may not be reused.

SUMMARY

In an embodiment, a method of over-current protection includes: determining a current flowing through a first element to be protected, comparing the determined current with a plurality of thresholds, controlling a counter based on the comparing the determined current with a plurality of thresholds, and stopping the current flowing through the first element by activating a switch in series with the first element when an output of the counter reaches a predetermined counter threshold.

In an embodiment, a circuit includes: a current sensing circuit configured to sense a current through a first circuit device; a first comparator having a first input coupled to a first reference node and a second input coupled to the current sensing circuit; and a counter including a first control input coupled to an output of the first comparator, and an output configured to be coupled to a switch, the switch coupled in series with the current sensing circuit.

In an embodiment, a method of emulating current capabilities of a cable includes: monitoring a current flowing through the cable; comparing the current with a plurality of thresholds; controlling a counter based on the comparing the current with a plurality of thresholds; and determining that the current has exceeded the current capabilities of the cable when the counter reaches a predetermined counter threshold.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
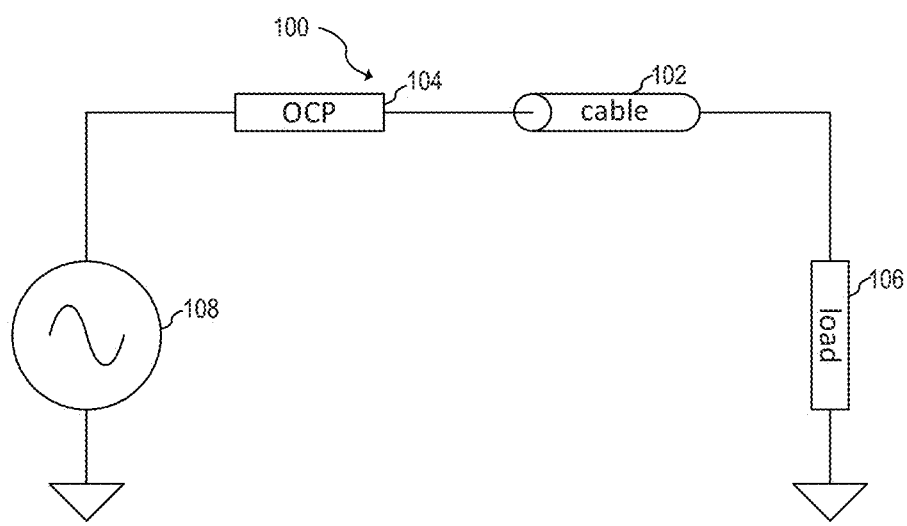
FIG. 1 shows a possible configuration of a system including a power source, a power cable, a load, and an over-current protection element.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for over-current protection (OCP) for a power cable. Embodiments of the present invention may also be applied to any cable that conducts electricity and various loads and various systems that may utilize over-current protection system and methods, such as, integrated circuits, and power supplies.

In an embodiment of the present invention, an over-current protection circuit is configured to emulate a cable's current handling capability based on a measured cable current, and uses results of the emulation to determine when to disconnect power from the cable or limit the current flowing through it. In some embodiments, the emulation is performed by comparing the cable's current to a plurality of thresholds using a corresponding plurality of comparators whose outputs used to control a digital counter. The output of the digital counter is used to determine the existence of an over current condition. This overcurrent condition is indicated, for example, by an overflow of the counter and the power may be disconnected from the cable via an external switch coupled in series with the power cable. In some embodiments, the cable current is determined by measuring a voltage across a resistor coupled in series with the cable.

Power cables are an assembly of one or more cables configured for transmission of electrical power. Power cables may be rated according to the amount of current that they can safely and reliably conduct, also known as the power cable's current carrying capacity. A power cable's nominal current is typically used as a key power cable specification. A system designer may, for example, select a power cable rated with a nominal current of 10 A for a system that exhibits maximum peak currents of 10 A.

All else being equal, thicker power cables are generally capable of handling more current than thinner power cables. Selecting a thinner power cable may have advantages, such as lower cost and lower weight. Selecting a power cable that is thinner than required, however, may result in system malfunctions or safety hazards. For example, when a power cable is subjected to currents above its rating, the power cable's insulation may melt, which may result in leakage currents or short circuit conditions. There is an incentive, therefore, to select a power cable that is as thin as possible, but capable of conducting the worst case system currents. There is also an incentive to ensure that the power cable is not subjected to over-current events.

Over-current protection elements may be used to ensure that the current flowing through the power cable does not exceed the power cable's current capabilities. FIG. 1 shows a possible configuration of a system including power source 108, power cable 102, load 106 and over-current protection element 104.

During normal operation, electricity may flow from power source 108, through over-current protection element 104, power cable 102, and into load 106. When an over-current event occurs, over-current protection element 104 may limit or stop current flowing through it, thereby protecting power cable 102 and load 106. The triggering of the over-current protection element is also known as tripping.

Figure 2A:
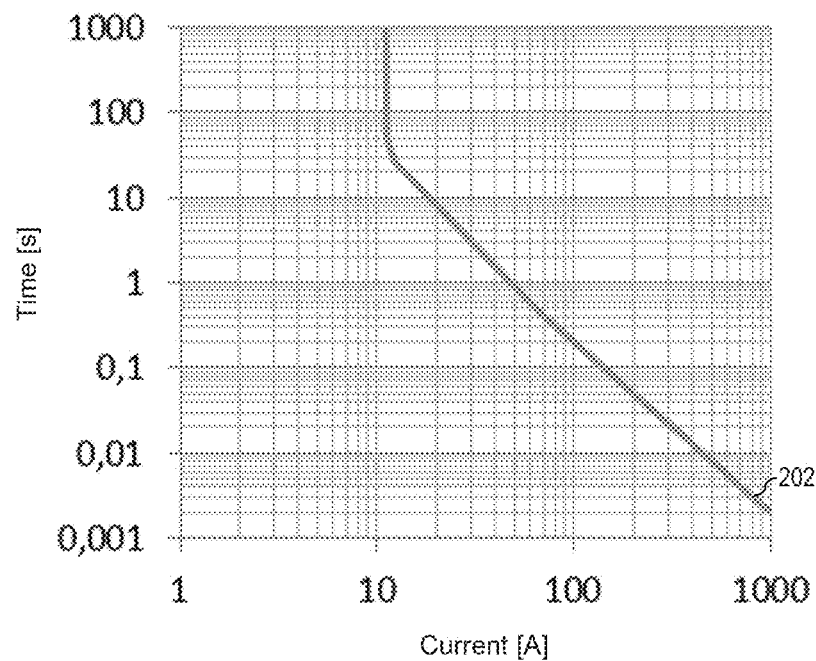
FIG. 2A shows a typical time-current characteristic curve of a power cable.

Electricity flowing through a power cable may vary over time. A power cable rated for a nominal current of, for example, 10 A, may be capable of safely conducting currents higher than 10 A for short periods of time. A time-current characteristic ($I^2t$) curve, therefore, may be used to illustrate the maximum current capabilities of a particular power cable. FIG. 2A shows a typical $I^2t$ curve 202 of a 0.5 mm$^2$ power cable at 25° C. of temperature. As can be seen from FIG. 2A, the lower the amount of time of a current pulse, the higher the current that can be safely and reliably conducted by the 0.5 mm$^2$ power cable. For example, the 0.5 mm$^2$ power cable may safely and reliably conduct 100 A pulses lasting less than 50 ms, but may only safely and reliably conduct 10 A continuously.

Different types of over-current protection elements may be used to protect power cables. Fuses, for example, are typically made of a metal wire configured to melt when a current above its tripping point flows through it. Once a fuse trips, it creates an open circuit, thereby interrupting the flow of current through it. Tripping a fuse is an irreversible event, which in some systems may require the fuse's replacement.

Figure 2B:
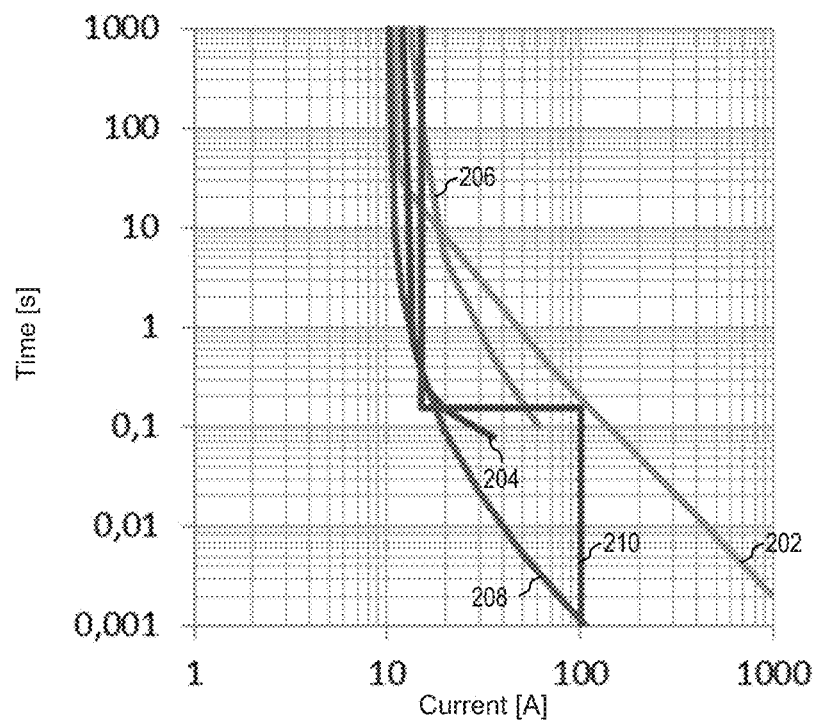
FIG. 2B shows typical time-current characteristic curves for various over-current protection technologies.

Over-current protection elements, such as fuses, may also exhibit different current tripping thresholds depending on the amount of time the current is flowing through it. An over-current protection element tripping characteristic, therefore, may also be captured by an $I^2t$ curve. FIG. 2B shows typical $I^2t$ curves for various over-current protection technologies, including a particular model of fuses' $I^2t$ curves represented with minimum fuse current $I^2t$ curve 204 and maximum fuse $I^2t$ curve 206, RC filter $I^2t$ curve 208, and programmable time-level $I^2t$ curve 210.

An over-current protection element's $I^2t$ curve is typically below the cable's $I^2t$ curve to ensure that currents flowing through the power cable do not exceed the power cable's capabilities. A fuse's triggering performance, for example, tends to vary considerably, even among samples of the same model. Minimum fuse $I^2t$ curve 204 and maximum fuse $I^2t$ curve 206 depict the minimum and maximum triggering thresholds, respectively, of a particular fuse model. For safety critical applications, the maximum fuse $I^2t$ curve may be used in combination with the power cable's $I^2t$ curve to ensure that all fuse samples will trip with a current that does not violate the power cable's capabilities. Minimum fuse $I^2t$ curve may be used to ensure that the system's current requirements will be delivered without causing a fuse to trip. A system using fuses, therefore, may use power cables thicker than if an over-current protection element with less variation were used.

RC filter techniques may be used as an alternative to using fuses. This technique monitors the current flowing through the power cable and integrates it with an RC filter. An over-current event is determined when the output of the RC filter is higher than a predetermined threshold. RC filter $I^2t$ curve 208 shows the tripping characteristic of a particular RC filter implementation. After an over-current event is detected, the circuit may be configured to open a switch in series with the power cable to stop the flow of current through it.

A programmable time-level current technique may also be used for over current protection. This technique may monitor the current flowing through the power cable, tripping when the current is above a first threshold for a first predetermined time, and when the current is above a second threshold higher than the first threshold for a second predetermined time shorter than the first predetermined time. Programmable time-level $I^2t$ curve 210 shows the tripping characteristic of a particular implementation of a programmable time-level current technique. Programmable time-level $I^2t$ curve 210 has two discrete tripping thresholds depending on the duration of the current pulse, one corresponding to about 10.5 A for pulses longer than about 150 ms, and another corresponding to about 100 A for pulses shorter than about 150 ms.

In some embodiments of the present invention, the $I^2t$ curve of power cable 102 is emulated by monitoring current $I_{cable}$, comparing current $I_{cable}$ with a plurality of thresholds, and configuring the counting speed and counting direction of current profile digital counter 314 based on how high current $I_{cable}$ is. An overflow event of current profile digital counter 314 may indicate that the $I^2t$ curve of power cable 102 has been exceeded. The overflow signal, therefore, may be used to stop or limit current $I_{able}$ to protect power cable 102, for example, by controlling switch 318.

Emulation refers to the ability of an element to replicate certain characteristics of another element. Emulation may be done in software, in hardware, or both, and has been used, for example, to allow one computer system to behave like another computer system.

Figure 3A:
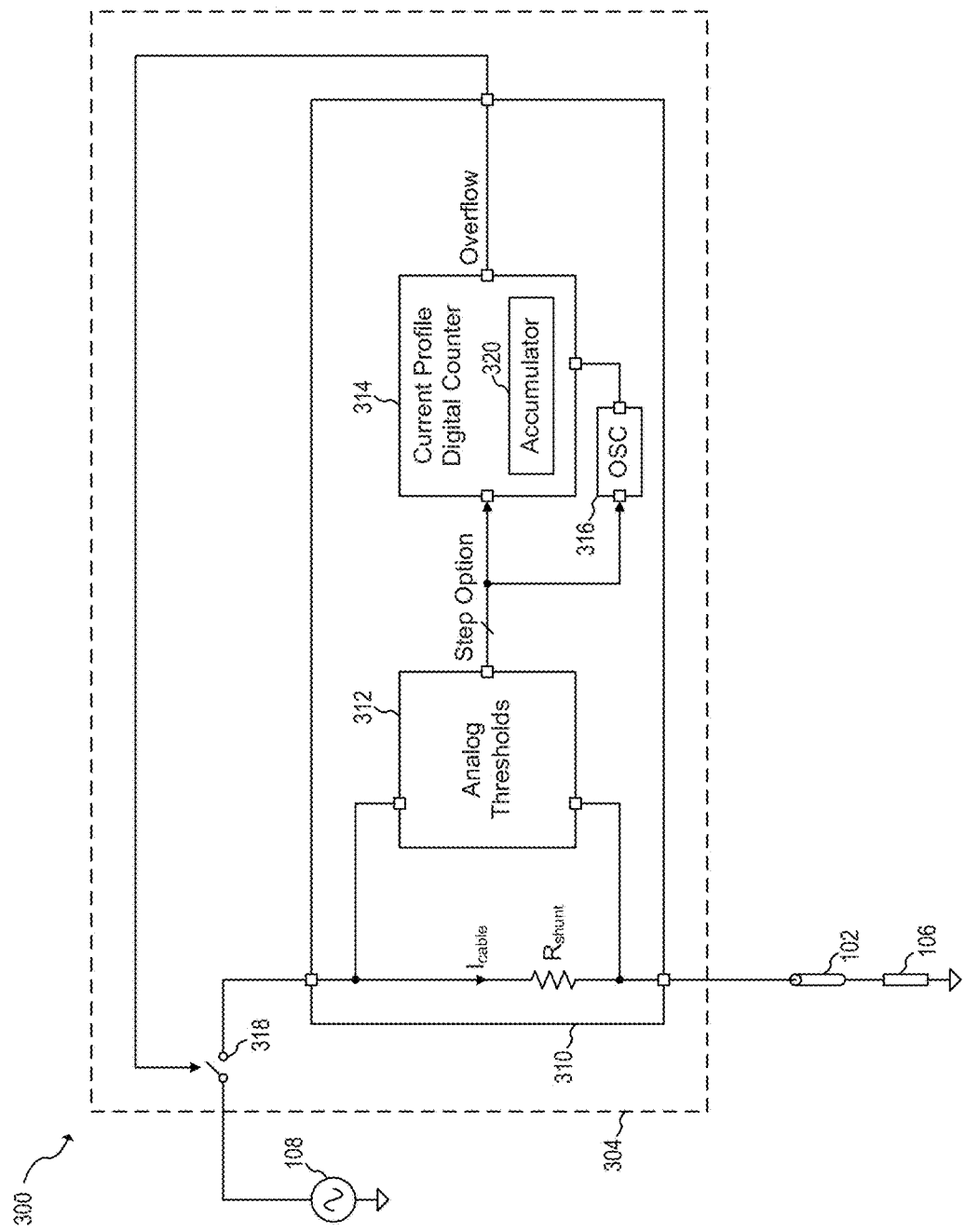
FIG. 3A shows a high level circuit schematic of an electrical system, according to an embodiment of the present invention.
Figure 3B:
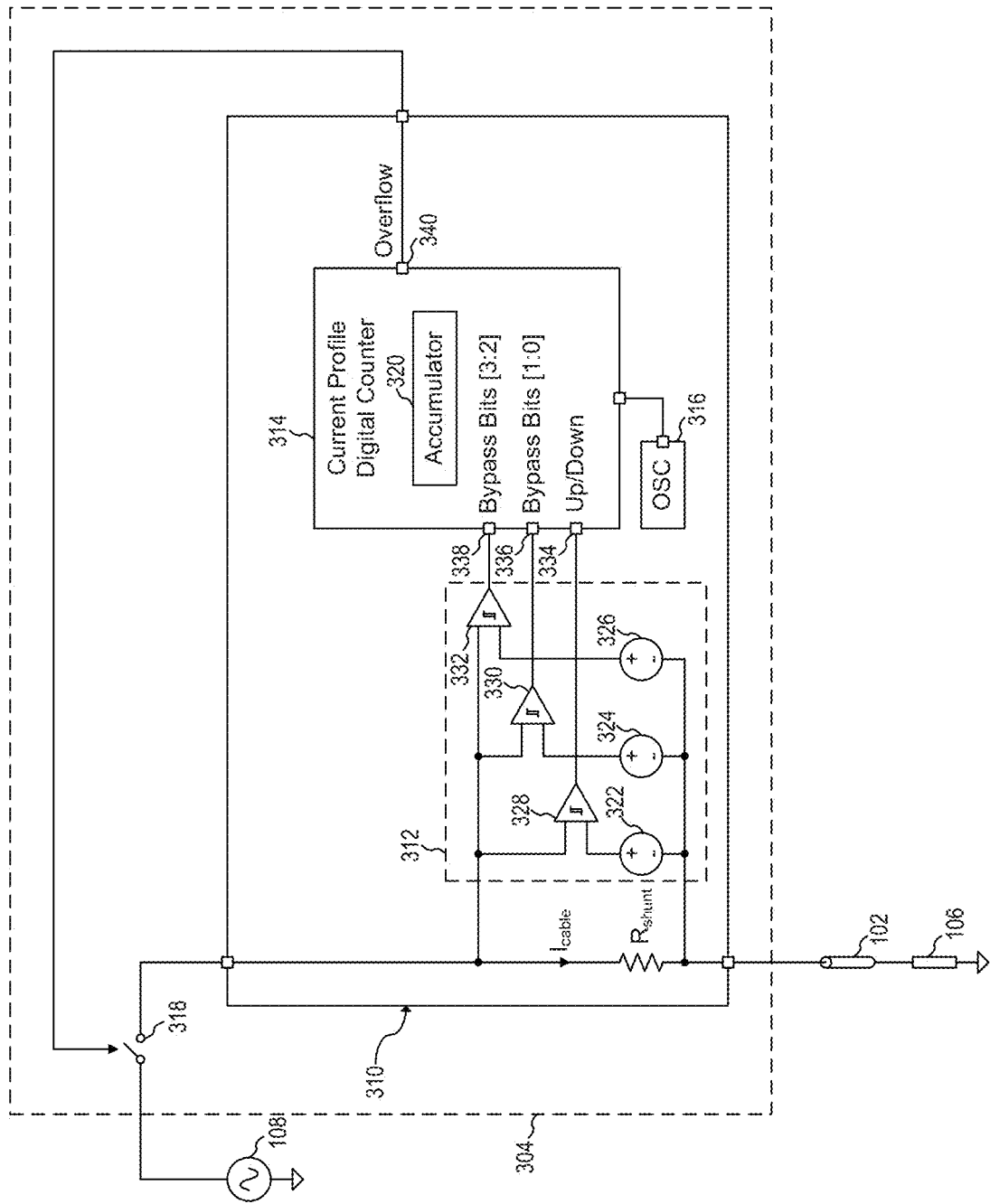
FIG. 3B illustrates a simplified schematic of an IC that shows details of an analog threshold circuit, and a current profile digital counter.
Figure 3C:
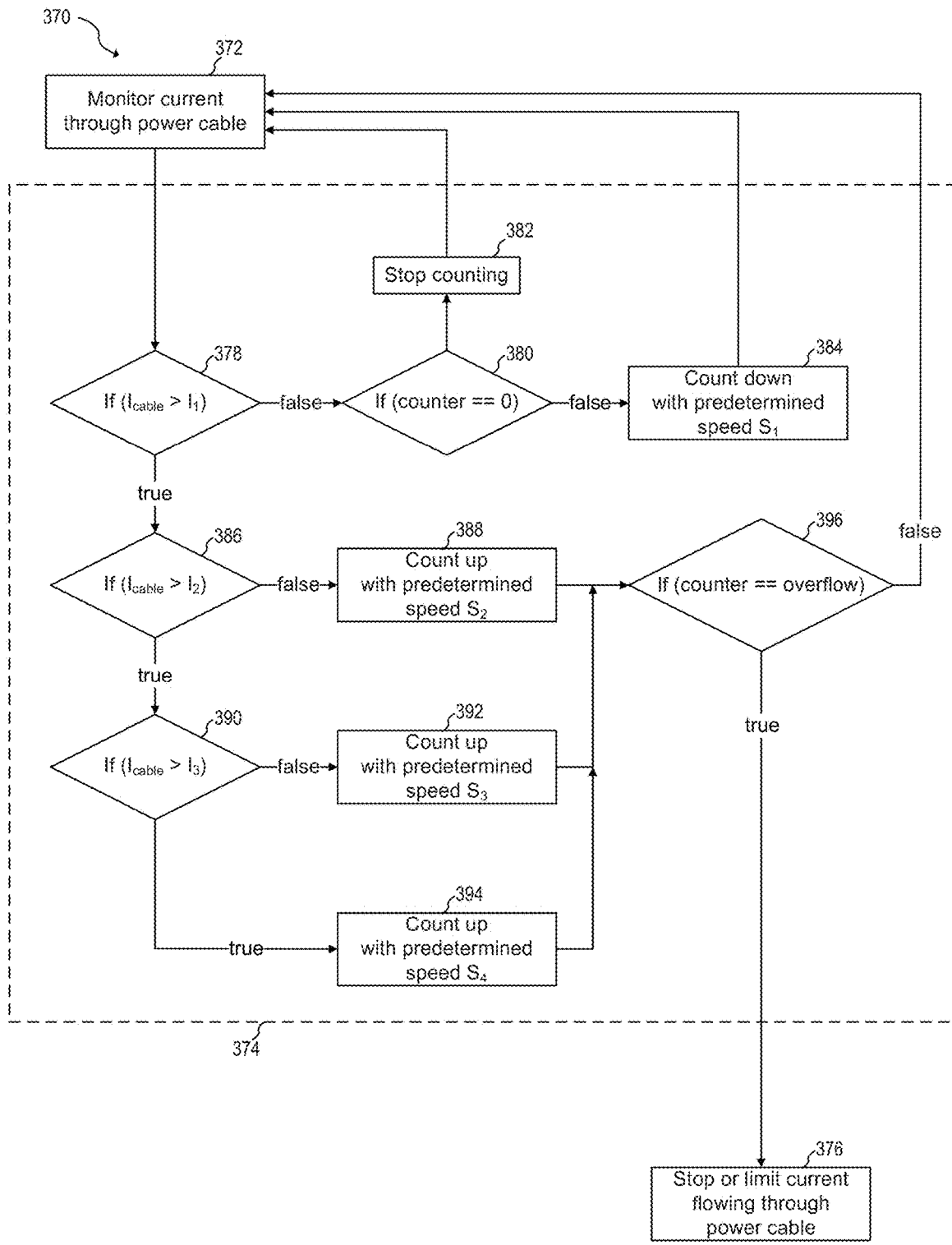
FIG. 3C illustrates a flow chart of an embodiment method for protecting a power cable from an over-current event.

FIGS. 3A-3C show electrical system 300 according to an embodiment of the present invention. Electrical system 300 is configured to transmit electrical power from power source 108 to load 106 through power cable 102. Over-current protection circuit 304 is configured to monitor current $I_{cable}$ flowing through power cable 102 by sensing a voltage drop across resistor $R_{shunt}$, comparing the monitored current $I_{cable}$ with an emulated version of the $I^2t$ curve of power cable 102, and opening switch 318 when current $I_{cable}$ exceeds the emulated version of the $I^2t$ curve. The emulated version of the $I^2t$ curve may be generated by using analog threshold circuit 312 and current profile digital counter 314.

FIG. 3A shows a high level circuit schematic of electrical system 300, according to an embodiment of the present invention. Electrical system 300 includes power source 108, over-current protection circuit 304, power cable 102, and load 106. Over-current protection circuit 304 includes switch 318, and integrated circuit (IC) 310. IC 310 includes resistor $R_{shunt}$, analog threshold circuit 312, current profile digital counter 314, and oscillator 316.

During normal operation, switch 318 is closed, and current $I_{cable}$ may flow from power source 108, through resistor $R_{shunt}$ and power cable 102, into load 106. Analog threshold circuit 312 monitors current $I_{cable}$, for example, by measuring a voltage across resistor $R_{shunt}$. Analog threshold circuit 312 includes a plurality of thresholds and periodically or continuously compares current $I_{cable}$ with each of the plurality of thresholds. Depending on how high current $I_{cable}$ is, analog threshold circuit 312 configures current profile digital counter 314 to count up, count down, or stop counting. The speed and direction in which the counter counts depends on how high current $I_{cable}$ is. An overflow of current profile digital counter 314 may be used as a trigger to control switch 318 to stop or limit current $I_{cable}$. Alternatively, a predetermined counting value may be stored, for example, in non-volatile memory or in a register, such that reaching the predetermined value is used as a trigger to control switch 318 to stop or limit current $I_{cable}$.

The counting speed of current profile digital counter 314 may be controlled in a variety of ways. For example, a counting step that gets added to accumulator 320 every clock cycle may be changed depending on how high current $I_{cable}$ is. A very high current $I_{cable}$ may correspond to a big counting step, a high current $I_{cable}$ may correspond to a small counting step, and a low current $I_{cable}$ may correspond to a negative counting step, in other words, a decrement of accumulator 320. Alternatively, the frequency of oscillator 316, which determines how fast a counting step gets added to accumulator 320, may be changed depending on how high current $I_{cable}$ is. For example, keeping the counting step size constant, a very high current $I_{cable}$ may correspond to a fast clock frequency while signaling current profile digital counter 314 to count up, a high current $I_{cable}$ may correspond to a slow clock frequency while signaling current profile digital counter 314 to count up, and a low current $I_{cable}$ may correspond to a slow clock frequency while signaling current profile digital counter 314 to count down. Some embodiments may change the counting step and the clock frequency concurrently. Other embodiments may have a plurality of counting up and counting down speeds.

Switch 318 may either allow or prevent the flow of electricity through it, such as a mechanical relay. Switch 318 may also be configured to limit the current flowing through it instead of completely preventing the flow of electricity. Techniques known in the art for limiting or regulating current flowing through a switch may be used. Switch 318 may be a mechanical switch, a bidirectional triode thyristor (TRIAC), a transistor, or any other component known in the art that may behave as a switch, including, but not limited to, transistors of the normally-on type and normally-off type, transistors of the n-type and p-type, metal oxide semiconductor field effect transistors (MOSFETs), power MOSFETs, junction field effect transistor (JFETs) high electron mobility transistor (HEMT) such as gallium nitride (GaN) HEMTs and insulated gate bipolar transistors (IGBTs), mechanical relay, solid state relays, Alternatively, other transistor types may be used. The selection of which switch to use may be made according to the specifications, voltage, and current levels of the particular electrical system being designed and appropriate adjustments to the circuit may be made to accommodate the particular device type. Switch 318 may be integrated inside IC 310 or, alternatively, may be a component external to IC 310.

IC 310 may integrate a variety of components of over-current protection circuit 304, such as resistor $R_{shunt}$, analog threshold circuit 312, current profile digital counter 314, and oscillator 316. In some embodiments, a different set of components may be integrated inside IC 310. Similarly, any of the components may be implemented external to IC 310. A fully discrete implementation is also possible.

Figure 3D:
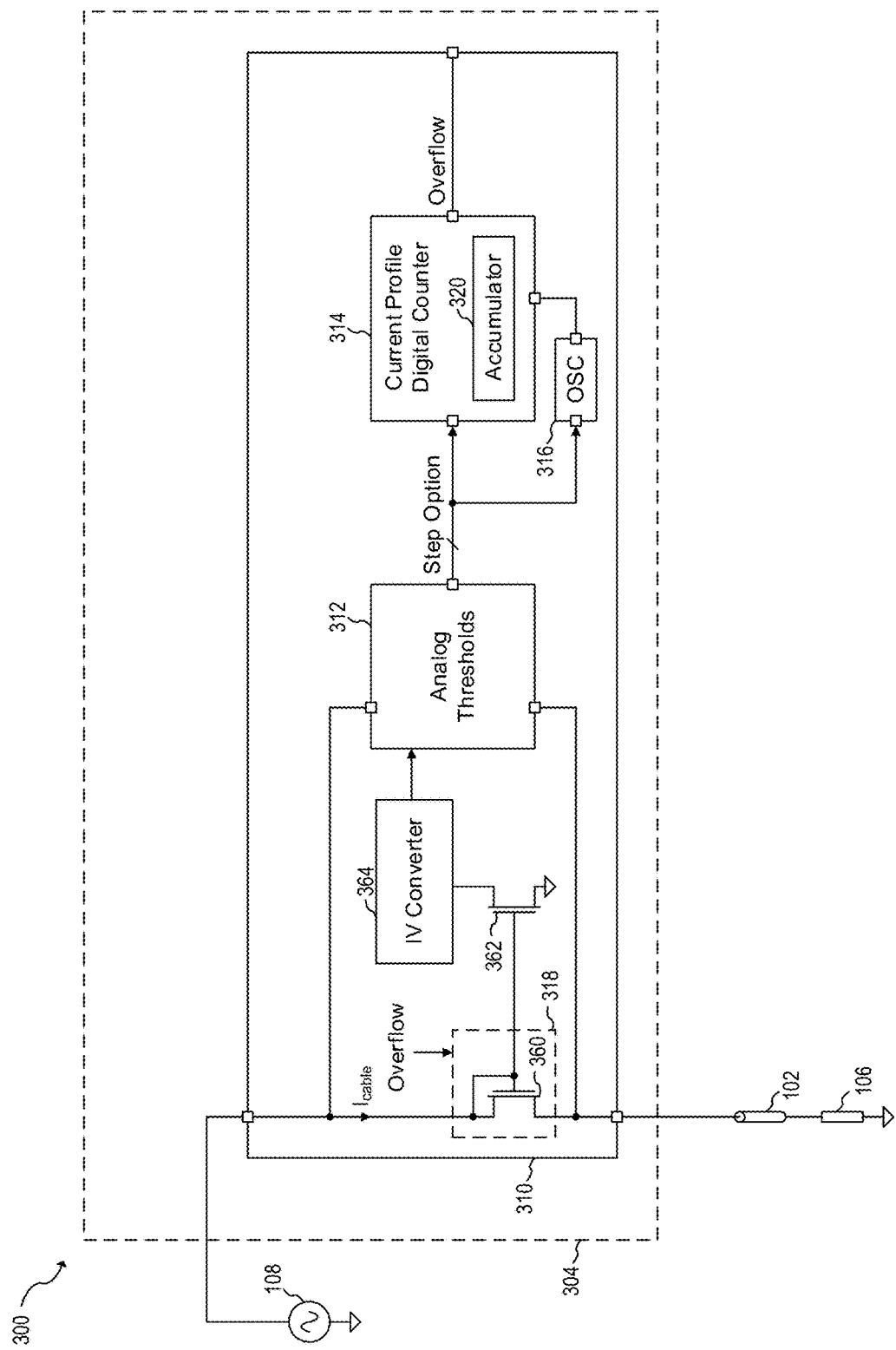
FIG. 3D shows a high level circuit schematic of an electrical system, according to an embodiment of the present invention.

Resistor $R_{shunt}$ may be used to sense current $I_{cable}$ by creating a voltage drop that can be amplified and measured by an external circuit. Resistor $R_{shunt}$ typically has a small resistance, such as 100 mΩ, which may reduce power dissipation and heat generation. Some embodiments may use the resistance of switch 318 to monitor current $I_{cable}$ instead of using resistor $R_{shunt}$. Other embodiments may use other techniques known in the art to measure current $I_{cable}$. For example, embodiments that implement switch 318 with a transistor (e.g., such as shown in FIG. 3D) may avoid using resistor $R_{shunt}$ and, instead, use current mirror techniques (e.g., using current mirror 360/362) to copy a scaled version of current $I_{cable}$, pass it through an I-V converter 364, and measure the voltage output of the I-V converter to monitor current $I_{cable}$.

Analog threshold circuit 312 includes a plurality of thresholds that are compared to current $I_{cable}$. Based on how current $I_{cable}$ compares to the plurality of thresholds, a counting step option for current profile digital counter 314 may be selected. Counting step options may include counting up or down, and the speed of the counting. The counting speed of current profile digital counter 314 may have a direct impact on how fast current profile digital counter 314 overflows. Thresholds may be selected to accurately emulate an $I^2t$ curve of power cable 102.

Oscillator 316 may be used as a clock for current profile digital counter 314. Oscillator 316 may be configured to switch at 300 kHz and may have a tolerance of, for example, +27%/−45%. Some embodiments may use oscillators with tighter tolerances, such as thermally compensated oscillators. Alternatively, an external crystal may be used to generate an accurate reference that may be subsequently divided. Other embodiments may use a controllable oscillator, such as a voltage controlled oscillator (VCO), which may be used to vary the oscillation frequency according to an input. Oscillator 316 may be implemented inside current profile digital counter 314. Alternatively, oscillator 316 may be implemented outside current profile digital counter 314. The use of oscillator 316 may be avoided, for example, by providing an external clock signal.

Current profile digital counter 314 may be used as a counter and accumulator. Current profile digital counter 314 may be capable of counting up and down, and may have a configurable counting step size. A counting step size may be configured, for example, by using two configuration bits, leading to four different counting speeds. Some embodiments, may have only one configuration bit, or may have more than two configuration bits. Other embodiments may not have a configuration bit and, instead, may have a single counting step size. Not all available counting step size may be used. The input frequency of current profile digital counter 314 may also be varied to control the counting speed. Some embodiments may use a hybrid approach, in which the input frequency is varied concurrently with the counting step size.

Current profile digital counter 314 may also include accumulator 320, which increments or decrements each clock cycle depending on the counting step size and the direction of the count. Accumulator 320 may have, for example, 23 bits, and may be configured to signal an overflow once the accumulator has 1's in all its bits. Accumulator 320 may also be configured to avoid circularity. In other words, if the accumulator has a count of zero and is decremented, it will stay at zero. Similarly, if the accumulator has 1's in all its bits and is incremented, it will stay with 1's in all its bits.

Advantages of various embodiment over-current protection circuits that utilize controllable switches include the ability to reuse the over-current protection over multiple overcurrent events. A further advantage of embodiments include the ability to implement an emulation-based overcurrent protection circuit using a low digital density semiconductor process, such as a Bipolar CMOS DMOS (BCD) process.

FIG. 3B illustrates a simplified schematic of IC 310 that shows details of analog threshold circuit 312, and current profile digital counter 314. As shown in FIG. 3B, analog threshold circuit 312 may have three thresholds, and may be implemented with comparators 328, 330 and 332, and references voltages 322, 324 and 326. Reference voltage 324 may be higher than reference voltage 322, and reference voltage 326 may be higher than reference voltage 324. Current profile digital counter 314 may have counting direction selection input 334 for controlling the counting direction and may have counting step size selection inputs 336 and 338 for selecting the counting step size. Some embodiments may use more than three thresholds or less than three thresholds. Appropriate adjustments to the circuit may be made to accommodate the particular number of thresholds used.

During normal operation, current $I_{cable}$ may flow through resistor $R_{shunt}$, creating a voltage across it. When the voltage across resistor $R_{shunt}$ is lower than reference voltage 322, all comparators have a low output, which in turn sets counting direction selection input 334 low, and counting step size selection inputs 336 and 338 low, configuring current profile digital counter 314 to count down with the smallest counting step size. When the voltage across resistor $R_{shunt}$ is higher than reference voltage 322 but lower than reference voltage 324, counting direction selection input 334 is set high while counting step size selection inputs 336 and 338 are set low, configuring current profile digital counter 314 to count up with the smallest counting step size. When the voltage across resistor $R_{shunt}$ is higher than reference voltage 324 but lower than reference voltage 326, counting direction selection input 334 and counting step size selection input 336 are set high while counting step size selection input 338 is set low, configuring current profile digital counter 314 to count up with a counting step size that may be four times larger than the smallest counting step size. Similarly, when the voltage across resistor $R_{shunt}$ is higher than reference voltage 326, counting direction selection input 334, and counting step size selection inputs 336 and 338 are set high, configuring current profile digital counter 314 to count up with a counting step size that may be sixteen times larger than the smallest counting step size.

Current profile digital counter 314 may be used to count up or down and may have configurable counting step sizes. Current profile digital counter 314 may include accumulator 320, which stores the current count and may be incremented or decremented each clock cycle by the counting step size. Configuring the counting direction and counting step size may be done by controlling counting direction selection input 334, and counting step size selection inputs 336 and 338, respectively. Changing the counting step size may be achieved in a variety of ways. For example, accumulator 320 may be incremented by one each clock cycle by adding or subtracting one from the least significant bit (LSB) of accumulator 320. By bypassing two LSBs of accumulator 320 (bits [1:0]), accumulator 320 would be incremented or decremented by one on bit 2 each cycle, which is equivalent to having a counting step size of four. Similarly, if the four LSBs of accumulator 320 are bypassed (bits [3:0]), accumulator 320 would be incremented or decremented by one on bit 4, which is equivalent to having a counting step size of sixteen. Other methods for changing the counting step size may also be implemented.

Accumulator 320 may have, for example, 23 bits to store the current count. A different number of bits may be used. Accumulator 320 may be configured to avoid circularity. In other words, when accumulator 320 is decremented by a counting step size larger than the current counting value, the accumulator may hold a count of zero. Similarly, when accumulator 320 is incremented by a counting step size larger than the subtraction between the maximum value that can be stored in accumulator 320 minus the current counting value, the accumulator may hold the maximum counting value. The condition where accumulator tries to increment to a value beyond its maximum storing value is known as overflow.

There are many factors that may affect how fast an overflow signal is generated. For example, an accumulator with a lower number of bits, driven by a higher frequency, or incremented by a higher counting step size may take a shorter time to reach overflow than an accumulator with a higher number of bits, driven by a slower frequency, or incremented by a lower counting step size. An analog threshold circuit with lower thresholds may cause the counter to reach overflow with less current flowing through resistor $R_{shunt}$ than an analog thresholds circuit with higher thresholds. A bigger resistor $R_{shunt}$ may cause the counter to reach overflow with less current flowing through resistor $R_{shunt}$ than a smaller resistor $R_{shunt}$. Other factors may also affect how fast an overflow signal is generated. Appropriate values may be selected for these factors such that the overflow signal is triggered when the current flowing through the power cable being protected exceeds the power cable's capabilities. In other words, it is possible to select appropriate values for these factors such that an accurate $I^2t$ curve of the protected power cable is obtained.

Advantages of embodiments that perform cable emulations to determine when to disconnect power from the cable includes the ability protect the cable over a very wide range of operating conditions. Enhanced accuracy of embodiment cable emulation circuits and systems may also alleviate or reduce the need to over specify cable thickness to compensate for inaccuracies in the over-current detection process.

FIG. 3C illustrates a flow chart of embodiment method 370 for protecting a power cable from an over-current event by monitoring a current flowing through the power cable, emulating the power cable $I^2t$ curve, and stopping or limiting the current through the power cable when the power cable emulation indicates that the current flowing through the power cable is above the power cable's capabilities. Method 370 may be implemented in electrical system 300, but it may also be implemented in other circuit architectures and in other ways known in the art. The discussion that follows assumes that electrical system 300, as shown in FIGS. 3A and 3B, implements method 370 for protecting a power cable from an over-current event.

Step 372 monitors current $I_{cable}$ flowing through power cable 102. The current monitoring may be done periodically or continuously, and may be implemented using techniques known in the art. Step 372 compares current $I_{cable}$ with an emulated version of the power cable configured to emulate the power cable's $I^2t$ curve. When step 372 determined that the current $I_{cable}$ exceeds the emulated $I^2t$ curve, step 376 stops or limits current $I_{cable}$. Otherwise, step 372 gets executed.

The emulated $I^2t$ curve may be below the power cable's $I^2t$ curve such that when the emulator implementing the emulated $I^2t$ curve indicates that the emulated $I^2t$ curve has been exceeded, current flowing through the power cable can be stopped or limited without subjecting the power cable to currents that would exceed the power cable's $I^2t$ curve.

Step 374 may be implemented as follows. Step 378 compares current $I_{cable}$ with a first current threshold $I_1$. If current $I_{cable}$ is lower than first current threshold $I_1$, step 380 gets executed. Otherwise step 386 gets executed. Step 380 compares whether the counter count is at zero, if it is not, the counter is decremented with a predetermined speed $S_1$ in step 384. Otherwise, step 382 stops the counting and step 372 gets executed. Step 386 compares current $I_{cable}$ with a second current threshold $I_2$ greater than the first current threshold $I_1$. If current $I_{cable}$ is lower than second current threshold $I_2$, step 388 configures current profile digital counter 314 to count up with a predetermined speed $S_2$ and then step 396 gets executed. Otherwise step 390 gets executed. Similarly, step 390 compares current $I_{cable}$ with a third current threshold $I_3$ greater than the second current threshold $I_2$. If current $I_{cable}$ is lower than third current threshold $I_3$, step 392 configures current profile digital counter 314 to count up with a predetermined speed $S_3$ and then step 396 gets executed. Otherwise step 394 configures current profile digital counter 314 to count up with a predetermined speed $S_4$ and then step 396 gets executed. Step 396 checks whether a counter overflow has occurred. If it has, step 376 gets executed. Otherwise, step 372 gets executed.

Even though method 370 shows three analog thresholds, namely first current threshold $I_1$, second current threshold $I_2$, and third current threshold $I_3$, method 370 may be implemented with more analog thresholds, and with less analog thresholds. Predetermined speeds $S_1$, $S_2$, $S_3$ and $S_4$ may all be different from each other. Alternatively, some predetermined speeds may be equal to others. The number of analog thresholds, and the particular speeds implemented may be selected, in part, based on the characteristics of the emulated $I^2t$ curve.

An advantage of method 370 in some embodiments is that it may be implemented by a variety of systems. For example, in addition to electrical system 300, method 370 may be implemented with commercially available general purpose micro-controllers. Since implementing method 370 may not require multiplications or divisions, even a low-end micro-controller may implement it. An FPGA implementation is also possible.

Figure 4:
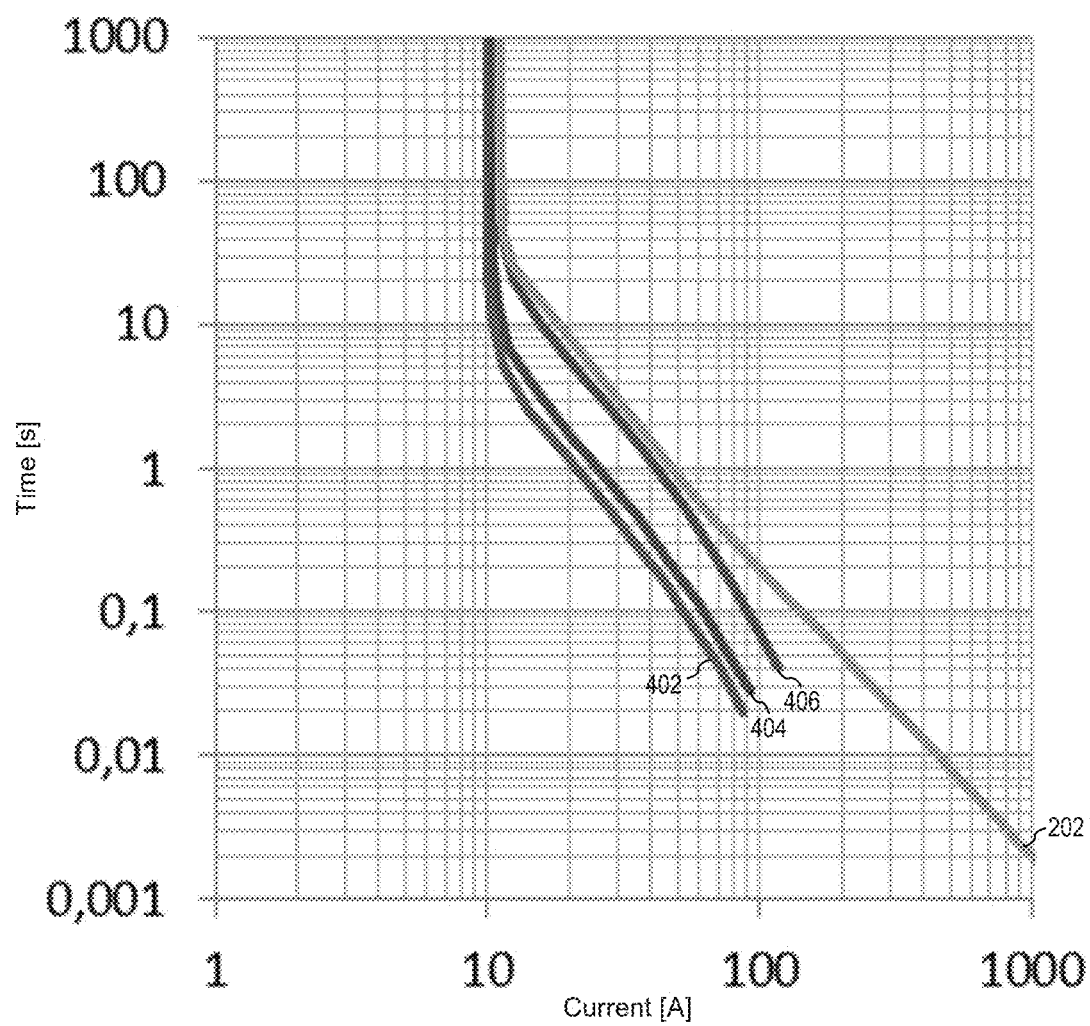
FIG. 4 shows $I^2t$ curves for an embodiment of the present invention configured to emulate a power cable.

The error between the emulated $I^2t$ curve and the power cable's $I^2t$ curve is an important parameter. FIG. 4 shows $I^2t$ curves for an embodiment of the present invention configured to emulate a 0.5 mm$^2$ power cable. The implementation used to create these curves used a current measurement circuit with a tolerance of 5%, an accumulator of 23 bits, and an oscillator with a frequency of 300 kHz with and a tolerance of +27%/−45%. $I^2t$ curves 402, 404, and 406 correspond to the minimum, typical, and maximum $I^2t$ curves, respectively, and illustrate the variation that may be experienced by different samples of this particular embodiment. As can be seen from FIG. 4, curves 402, 404, and 406 closely track $I^2t$ curve 202 of the 0.5 mm$^2$ power cable despite the oscillator and current measurement tolerances. An even higher accuracy may be achieved by improving on the tolerances of the individual components.

Figure 5:
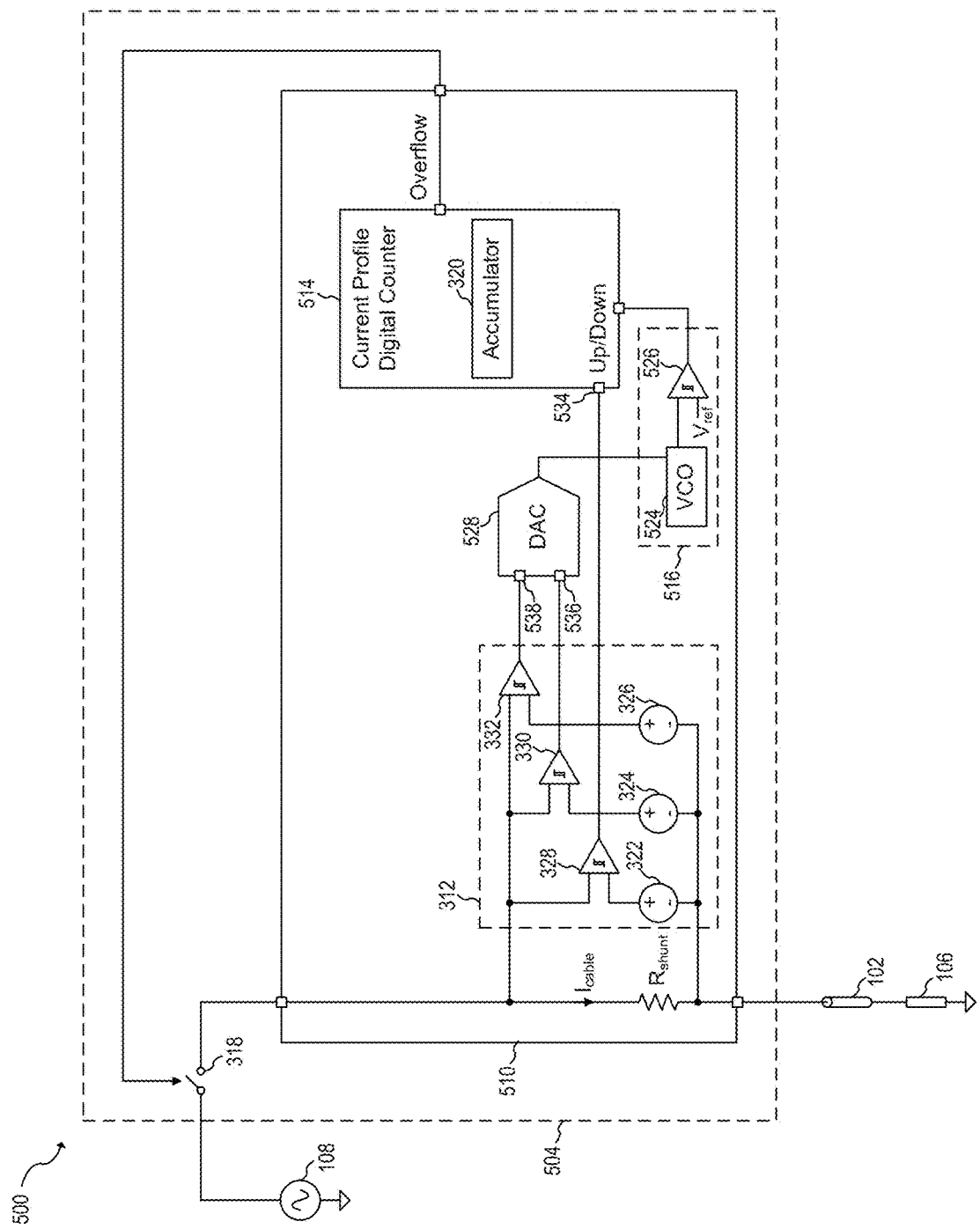
FIG. 5 illustrate an electrical system according to a further embodiment of the present invention.

FIG. 5 illustrates electrical system 500 according to a further embodiment of the present invention. Similar to electrical system 300, electrical system 500 is configured to transmit electrical power from power source 108 to load 106 through power cable 102. Over-current protection circuit 504 is configured to monitor current $I_{cable}$ flowing through power cable 102 by sensing a voltage drop across resistor $R_{shunt}$, comparing the monitored current $I_{cable}$ with an emulated version of the $I^2t$ curve of power cable 102, and opening switch 318 when current $I_{cable}$ exceeds the emulated version of the $I^2t$ curve. The emulated version of the $I^2t$ curve may be generated by using analog threshold circuit 312 and current profile digital counter 514.

Electrical system 500 may operate in a similar manner as electrical system 300, and may implement method 370 for protecting a power cable from an over-current event. Electrical system 500, however, varies the oscillator frequency instead of the counting step size in order to modify the counting speed. The frequency may be varied, for example, by the use of VCO 524. Comparator 526 may be used to ensure the clock input of current profile digital counter 514 is a square wave. Digital-to-analog converted (DAC) 528 may be used to vary the input voltage of VCO 524 in order to control the output frequency of VCO 524.

When the voltage across resistor $R_{shunt}$ is lower than reference voltage 322, counting direction selection input 534 is set low, and DAC inputs 536 and 538 are set low, configuring current profile digital counter 514 to count down and DAC 528 to output a low voltage that translates to a slow frequency of VCO 524. When the voltage across resistor $R_{shunt}$ is higher than reference voltage 322 but lower than reference voltage 324, counting direction selection input 534 is set high, configuring current profile digital counter 514 to count up, while DAC inputs 536 and 538 are set low, configuring the frequency of VCO 524 to a slow frequency. When the voltage across resistor $R_{shunt}$ is higher than reference voltage 324 but lower than reference voltage 326, counting direction selection input 534, and DAC input 536 are set high while DAC input 538 is set low, configuring current profile digital counter 514 to count up and the frequency of VCO 524 to a medium frequency. Similarly, when the voltage across resistor $R_{shunt}$ is higher than reference voltage 326, counting direction selection input 534, and DAC inputs 536 and 538 are set high, configuring current profile digital counter 514 to count up and the frequency of VCO 524 to a high frequency.

DAC 528 is configured to output a voltage based on DAC inputs 536 and 538. DAC 528 may have two inputs, but may also be implemented with one input, or with more than two inputs. The output voltage of DAC 528 may be configured to have any range. DAC 528, however, may be configured to have a range that would configure VCO 524 to generate suitable frequencies for a desired counting speed.

VCO 524 is configured to output an oscillating signal with a frequency based on its input voltage. A lower input voltage typically corresponds with a slower output frequency, and a higher input voltage typically corresponds to a higher output frequencies. Alternatively, some embodiments may configure VCO 524 to output a faster frequency corresponding to a lower input voltage, and a slower frequency corresponding to a higher input voltage. Comparator 526 may be required to ensure that the output of oscillator 516 is a square wave.

Example embodiments of the present invention are summarized here. Other embodiments can also be understood from the entirety of the specification and the claims filed herein.

EXAMPLE 1

A method of over-current protection including: determining a current flowing through a first element to be protected; comparing the determined current with a plurality of thresholds; controlling a counter based on the comparing the determined current with a plurality of thresholds; and stopping the current flowing through the first element by activating a switch in series with the first element when an output of the counter reaches a predetermined counter threshold.

EXAMPLE 2

The method of example 1, where the counter overflows at the predetermined counter threshold.

EXAMPLE 3

The method of one of examples 1 or 2, further including comparing the output of the counter with the predetermined counter threshold, where the predetermined counter threshold is stored in a digital register.

EXAMPLE 4

The method of one of examples 1 to 3, where the determining the current flowing through the first element to be protected includes measuring a voltage across a resistor coupled to the first element.

EXAMPLE 5

The method of one of examples 1 to 4, where the controlling the counter includes: configuring the counter to count down with a first speed when the determined current is below a first threshold; and configuring the counter to count up with a second speed when the determined current is above the first threshold.

EXAMPLE 6

The method of one of examples 1 to 5, where the first speed and the second speed are equal.

EXAMPLE 7

The method of one of examples 1 to 5, where the first speed is lower than the second speed.

EXAMPLE 8

The method of one of examples 1 to 7, where the controlling the counter further includes: configuring the counter to count up with a third speed greater than the second speed when the determined current is above a second threshold, the second threshold being higher than the first threshold.

EXAMPLE 9

The method of one of examples 1 to 8, where the third speed is higher than the second speed.

EXAMPLE 10

The method of one of examples 1 to 9, where the first element is a cable.

EXAMPLE 11

A circuit including: a current sensing circuit configured to sense a current through a first circuit device; a first comparator having a first input coupled to a first reference node and a second input coupled to the current sensing circuit; and a counter including a first control input coupled to an output of the first comparator, and an output configured to be coupled to a switch, the switch coupled in series with the current sensing circuit.

EXAMPLE 12

The circuit of example 11, further including the first circuit device.

EXAMPLE 13

The circuit of one of examples 11 or 12, where the first circuit device is a cable.

EXAMPLE 14

The circuit of one of examples 11 to 13, where the current sensing circuit, the first comparator, and the counter are integrated inside an integrated circuit.

EXAMPLE 15

The circuit of one of examples 11 to 14, further including the switch.

EXAMPLE 16

The circuit of one of examples 11 to 15, where the current sensing circuit, the first comparator, the counter, and the switch are integrated inside an integrated circuit.

EXAMPLE 17

The circuit of one of examples 11 to 16, where the switch is a mechanical relay; the counter has an accumulator with 23 bits; and the current sensing circuit comprises a resistor.

EXAMPLE 18

The circuit of one of examples 11 to 16, where the switch (e.g., 318) is a first transistor (e.g., 360), and where the current sensing circuit comprises a second transistor (e.g., 360 or 362).

EXAMPLE 19

The circuit of one of examples 11 to 18, where the first transistor (e.g., 360) and the second transistor (e.g., 360) are the same transistor.

EXAMPLE 20

The circuit of one of examples 11 to 19, where the first control input selects between counting up or counting down.

EXAMPLE 21

The circuit of one of examples 11 to 19, where the first control input selects between a first step size and a second step size, the first step size being smaller than the second step size.

EXAMPLE 22

The circuit of one of examples 11 to 19, where the first control input selects between a first counting frequency and a second counting frequency, the first counting frequency being smaller than the second counting frequency.

EXAMPLE 23

The circuit of one of examples 11 to 22, further including: a second reference node configured to be used as a reference voltage; and a second comparator coupled to the second reference node and to the current sensing circuit, the second comparator having a second comparator output, where the counter further comprises a second control input coupled to the second comparator output, where the first control input selects between counting up or counting down, and where the second control input selects between a first step size and a second step size, the first step size being smaller than the second step size.

EXAMPLE 24

A method of emulating current capabilities of a cable, the method including: monitoring a current flowing through the cable; comparing the current with a plurality of thresholds; controlling a counter based on the comparing the current with a plurality of thresholds; and determining that the current has exceeded the current capabilities of the cable when the counter reaches a predetermined counter threshold.

EXAMPLE 25

The method of example 24, further including opening a switch in series with the cable when the counter reaches the predetermined counter threshold.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of over-current protection comprising:
    determining a current flowing through a first element to be protected using a current sensing circuit;
    comparing the determined current with a plurality of thresholds;
    controlling a counter based on the comparing the determined current with the plurality of thresholds; and
    stopping the current flowing through the first element by activating a switch in series with the first element when an output of the counter reaches a predetermined counter threshold, wherein comparing the determined current with the plurality of threshold comprises comparing the determined current with a first threshold of the plurality of thresholds using a first comparator having a first input coupled to a first reference node and a second input coupled to the current sensing circuit, and comparing the determined current with a second threshold of the plurality of thresholds using a second comparator coupled to a second reference node and to the current sensing circuit, and wherein controlling the counter comprises selecting between counting up or down based on an output of the first comparator, and selecting between a first step size and a second step size based on an output of the second comparator, the first step size being smaller than the second step size.

2. The method of claim 1, wherein the counter overflows at the predetermined counter threshold.

3. The method of claim 1, further comprising comparing the output of the counter with the predetermined counter threshold, wherein the predetermined counter threshold is stored in a digital register.

4. The method of claim 1, wherein the determining the current flowing through the first element to be protected comprises measuring a voltage across a resistor coupled to the first element.

5. The method of claim 1, wherein the controlling the counter comprises:
    configuring the counter to count down with a first speed when the determined current is below the first threshold; and
    configuring the counter to count up with a second speed when the determined current is above the first threshold.

6. The method of claim 5, wherein the first speed and the second speed are equal.

7. The method of claim 5, wherein the first speed is lower than the second speed.

8. The method of claim 5, wherein the controlling the counter further comprises:
    configuring the counter to count up with a third speed greater than the second speed when the determined current is above the second threshold, the second threshold being higher than the first threshold.

9. The method of claim 1, wherein the first element is a cable.

10. The method of claim 1, wherein the counter comprises an accumulator with 23 bits.

11. A circuit comprising:
    a current sensing circuit configured to sense a current through a first circuit device;
    a first comparator having a first input coupled to a first reference node and a second input coupled to the current sensing circuit;

a counter comprising a first control input coupled to an output of the first comparator, and an output configured to be coupled to a switch, the switch coupled in series with the current sensing circuit;

a second reference node configured to be used as a reference voltage; and a second comparator coupled to the second reference node and to the current sensing circuit, the second comparator having a second comparator output, wherein the counter further comprises a second control input coupled to the second comparator output, wherein the first control input selects between counting up or counting down, and wherein the second control input selects between a first step size and a second step size, the first step size being smaller than the second step size.

12. The circuit of claim 11, further comprising the first circuit device.

13. The circuit of claim 11, wherein the first circuit device is a cable.

14. The circuit of claim 11, wherein the current sensing circuit, the first comparator, and the counter are integrated inside an integrated circuit.

15. The circuit of claim 11, further comprising the switch.

16. The circuit of claim 15, wherein the current sensing circuit, the first comparator, the counter, and the switch are integrated inside an integrated circuit.

17. The circuit of claim 15, wherein
the switch is a mechanical relay;
the counter has an accumulator with 23 bits; and
the current sensing circuit comprises a resistor.

18. The circuit of claim 15, wherein the switch is a first transistor.

19. The circuit of claim 18, wherein the current sensing circuit comprises a second transistor.

20. The circuit of claim 11, wherein the first control input selects between counting up or counting down.

21. The circuit of claim 11, wherein the first control input selects between a first step size and a second step size, the first step size being smaller than the second step size.

22. The circuit of claim 11, wherein the first control input selects between a first counting frequency and a second counting frequency, the first counting frequency being smaller than the second counting frequency.

23. A method of emulating current capabilities of a cable, the method comprising:
monitoring a current flowing through the cable with a current sensing circuit;
comparing the current with a plurality of thresholds;
controlling a counter based on the comparing the current with the plurality of thresholds; and
determining that the current has exceeded the current capabilities of the cable when the counter reaches a predetermined counter threshold, wherein comparing the determined current with the plurality of threshold comprises comparing the determined current with a first threshold of the plurality of thresholds using a first comparator having a first input coupled to a first reference node and a second input coupled to the current sensing circuit, and comparing the determined current with a second threshold of the plurality of thresholds using a second comparator coupled to a second reference node and to the current sensing circuit, and wherein controlling the counter comprises selecting between counting up or down based on an output of the first comparator, and selecting between a first step size and a second step size based on an output of the second comparator, the first step size being smaller than the second step size.

24. The method of claim 23, further comprising opening a switch in series with the cable when the counter reaches the predetermined counter threshold.

25. The method of claim 24, wherein the switch comprises a transistor.

* * * * *